(12) United States Patent
Marzaki

(10) Patent No.: US 11,271,075 B2
(45) Date of Patent: Mar. 8, 2022

(54) PROCESS FOR FABRICATING A HIGH-VOLTAGE CAPACITIVE ELEMENT, AND CORRESPONDING INTEGRATED CIRCUIT

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/802,871

(22) Filed: Feb. 27, 2020

(65) Prior Publication Data
US 2020/0286986 A1   Sep. 10, 2020

(30) Foreign Application Priority Data

Mar. 6, 2019 (FR) ...................................... 1902277

(51) Int. Cl.
*H01L 21/00* (2006.01)
*H01L 49/02* (2006.01)
*H01L 27/11521* (2017.01)
*H01L 27/11531* (2017.01)
*H01L 29/423* (2006.01)
(Continued)

(52) U.S. Cl.
CPC ........ *H01L 28/91* (2013.01); *H01L 27/11521* (2013.01); *H01L 27/11531* (2013.01); *H01L 29/4236* (2013.01); *H01L 29/66825* (2013.01); *H01L 29/7883* (2013.01)

(58) Field of Classification Search
CPC ............... H01L 28/91; H01L 27/11521; H01L 27/11531; H01L 29/4236; H01L 29/66825; H01L 29/7883
See application file for complete search history.

(56) References Cited

U.S. PATENT DOCUMENTS 5,057,448 A * 10/1991 Kuroda ............. H01L 27/10852
                                                                  438/241
5,180,680 A *  1/1993 Yang ................. H01L 27/11556
                                                                  438/259
(Continued)

FOREIGN PATENT DOCUMENTS

CN          105914138 A    8/2016
FR            2978867 A1   2/2013

OTHER PUBLICATIONS

NPI Search Report and Written Opinion for FR 1902277 dated Dec. 18, 2019 (10 pages).

*Primary Examiner* — Richard A Booth
(74) *Attorney, Agent, or Firm* — Crowe & Dunlevy

(57) ABSTRACT

A semiconductor substrate has a front face with a first dielectric region. A capacitive element includes, on a surface of the first dielectric region at the front face, a stack of layers which include a first conductive region, a second conductive region and a third conductive region. The second conductive region is electrically insulated from the first conductive region by a second dielectric region. The second conductive region is further electrically insulated from the third conductive region by a third dielectric region. The first and third conductive regions form one plate of the capacitive element, and the second conductive region forms another plate of the capacitive element.

9 Claims, 3 Drawing Sheets

(51) Int. Cl.
   *H01L 29/66*   (2006.01)
   *H01L 29/788*  (2006.01)

(56) References Cited

U.S. PATENT DOCUMENTS

| | | | |
|---|---|---|---|
| 5,550,072 A | * | 8/1996 | Cacharelis .......... H01L 27/0611 |
| | | | 438/201 |
| 2003/0080366 A1 | * | 5/2003 | Tamura ............. H01L 27/11526 |
| | | | 257/298 |
| 2005/0139887 A1 | | 6/2005 | Song |
| 2010/0158072 A1 | * | 6/2010 | Fornara ................ H01H 1/0036 |
| | | | 374/152 |
| 2010/0200909 A1 | | 8/2010 | Kawashima et al. |
| 2011/0095348 A1 | | 4/2011 | Chakihara et al. |
| 2013/0032874 A1 | | 2/2013 | Ko |
| 2021/0082715 A1 | * | 3/2021 | Rubloff ............. H01L 21/02636 |

\* cited by examiner

PROCESS FOR FABRICATING A HIGH-VOLTAGE CAPACITIVE ELEMENT, AND CORRESPONDING INTEGRATED CIRCUIT

PRIORITY CLAIM

This application claims the priority benefit of French Application for Patent No. 1902277, filed on Mar. 6, 2019, the content of which is hereby incorporated by reference in its entirety to the maximum extent allowable by law.

TECHNICAL FIELD

Implementations and embodiments relate to integrated circuits, in particular to the fabrication of integrated circuits including high-voltage capacitive elements.

BACKGROUND

The term "high voltage" is understood to mean, for example, a voltage of the order of 3.5 V to 12 V.

There exist conventional capacitive elements formed on one face of a well formed in a semiconductor substrate, typically made of silicon. These conventional capacitive elements include a conductive layer, typically made of polycrystalline silicon, which is insulated from the substrate by a dielectric layer that is thick enough to allow operation at high voltages.

One electrode of the capacitive element is formed by the well and the other electrode is formed by the conductive layer. The term MOS (metal-oxide-silicon) capacitive element is then used.

The methods for forming such an electrode including a layer of a conductive material on one face of the well typically implement a step of levelling the conductive material, for example using a chemical-mechanical polishing (CMP) process or using a controlled-etch process such as a polysilicon-etchback (poly-etchback, PEB) process.

One improvement to such a capacitive element comprises an operation of forming an additional conductive layer, on top of the initial conductive layer. The conductive layers are insulated from one another by another dielectric layer.

The additional conductive layer is coupled to the substrate and belongs to the first electrode of the capacitive element, in what is referred to as a "sandwich" structure.

This has been made possible thanks to the existence of fabrication processes making provision for a second operation of forming a conductive layer on top of a first, and a required second levelling step. For example, the technologies for fabricating floating-gate transistors typically make provision for these steps.

That being said, it is difficult, in the processes for fabricating integrated circuits, to reiterate operations of forming conductive layers and the corresponding levelling steps, which are generally carried out over the entire surface of the substrate (or wafer).

Specifically, in the processes for fabricating integrated circuits, it is desirable to combine the fabrication steps for various elements in various parts of the integrated circuit, both for cost reasons and for reasons of architectural compatibility.

Meanwhile, it is desirable to improve the density of the capacitive elements, such as to decrease the footprint of the embodiments of capacitive elements.

It is also desirable to improve the performance of the capacitive elements, in particular to limit the parasitic effects introduced by the capacitive elements into neighboring elements, and to improve the linearity of the capacitive values of the capacitive elements.

SUMMARY

According to one aspect, an integrated circuit includes a semiconductor substrate having a front face, a first dielectric region extending into the substrate from the front face, and at least one capacitive element.

The capacitive element according to this aspect includes, on a surface of the dielectric region at the front face, a stack of a first conductive region, of a second conductive region and of a third conductive region, the second conductive region being electrically insulated from the first conductive region by a second dielectric region and electrically insulated from the third conductive region by a third dielectric region.

In other words, the capacitive element includes a stack of three conductive layers and is produced on one surface of a dielectric volume, and does not include any electrical connection with the semiconductor substrate.

Consequently, since it is isolated from the substrate, the capacitive element does not introduce any parasitic effect transmitted to neighboring components via the substrate and, since it does not use the semiconductor substrate electrically, the linearity and the density of the capacitive element are improved.

According to one embodiment, the second dielectric region and the third dielectric region are configured to withstand voltages of higher than 3.5 volts.

Advantageously, the second dielectric region and the third dielectric region are configured to withstand voltages of higher than 10 volts.

The second dielectric region may include a high-voltage oxide having a thickness of between 10 nm and 20 nm, for example 15 nm to within 10%, or includes a tunnel oxide having a thickness of between 5 nm and 15 nm, for example 10 nm to within 10%.

The third dielectric region may include a stack of a silicon oxide layer, of a silicon nitride layer and of a silicon oxide layer, the stack having a thickness of between 10 nm and 17 nm, for example 13 nm to within 10% or 15 nm to within 10%.

According to one embodiment, the capacitive element comprises a first electrode comprising the first conductive region and the third conductive region, and a second electrode comprising the second conductive region.

According to one embodiment, the first conductive region, the second conductive region and the third conductive region each comprise polycrystalline silicon.

The integrated circuit may further include an analog or radiofrequency-receiver device incorporating said at least one capacitive element, and a nonvolatile memory device incorporating at least one high-voltage transistor and/or at least one memory cell comprising a floating-gate transistor and/or a buried vertical-gate transistor.

Advantageously, and according to the respective "and/or" alternatives of this exemplary integrated circuit, said high-voltage transistor comprises a gate formed in the material of the second conductive region, said buried vertical-gate transistor comprises a vertical gate formed in the material of the first conductive region, said floating-gate transistor comprises a floating gate formed in the material of the second conductive region and/or comprises a control gate formed in the material of the third conductive region.

Advantageously, and likewise according to the respective "and/or" alternatives of this exemplary integrated circuit, said high-voltage transistor comprises a high-voltage gate oxide formed in the material of the second dielectric region or else said floating-gate transistor comprises a tunnel oxide formed in the material of the second dielectric region, and/or said floating-gate transistor comprises a control-gate dielectric region formed in the material of the third dielectric region.

According to another aspect, a process for fabricating an integrated circuit on a semiconductor substrate having a front face, comprising an operation of fabricating at least one capacitive element comprises: forming a first dielectric region comprising an operation of etching a trench in the substrate from the front face and an operation of filling the trench with a dielectric material; forming a first conductive region on a surface of the dielectric region at the front face; forming a second dielectric region on the first conductive region; forming a second conductive region on the first dielectric region; forming a third dielectric region on the first conductive region; and forming a third conductive region on the second dielectric region.

According to one implementation: forming the first conductive region takes place together with an operation of forming a conductive gate region of a buried vertical-gate transistor; forming the second dielectric region takes place together with an operation of forming a high-voltage gate oxide of a high-voltage transistor or with an operation of forming a tunnel oxide of a floating-gate transistor; forming the second conductive region takes place together with an operation of forming a conductive floating-gate region of the floating-gate transistor; forming the third dielectric region takes place together with an operation of forming a control-gate dielectric region of the floating-gate transistor; and forming the third conductive region takes place together with an operation of forming a control-gate conductive region of the floating-gate transistor.

This implementation has, in particular, the advantage of using fabrication steps that are already envisaged for fabricating a buried vertical-gate transistor and a floating-gate transistor, for example for producing a memory cell of a nonvolatile memory. Thus, costs specific to producing the capacitive element are minimal.

According to one implementation, forming the second dielectric region includes forming a high-voltage oxide having a thickness of between 10 nm and 20 nm, for example 15 nm to within 10%, or includes forming a tunnel oxide having a thickness of between 5 nm and 15 nm, for example 10 nm to within 10%.

According to one implementation, forming the third dielectric region includes an operation of forming a stack of a silicon oxide layer, of a silicon nitride layer and of a silicon oxide layer, the stack having a thickness of between 10 nm and 17 nm, for example 13 nm to within 10% or 15 nm to within 10%.

According to one implementation, the process further comprises forming a first electrode of a capacitive element comprising a coupling with the first conductive region and the third conductive region, and forming a second electrode of the capacitive element comprising a coupling with the second conductive region.

According to one implementation, forming the first conductive region, forming the second conductive region and forming the third conductive region each comprise forming polycrystalline silicon.

According to one implementation, fabricating said at least one capacitive element is incorporated within an operation of fabricating an analog or radiofrequency-receiver device of the integrated circuit.

BRIEF DESCRIPTION OF THE DRAWINGS

Other advantages and features of the invention will become apparent on examining the detailed description of completely non-limiting implementations and embodiments with reference to the appended figures, in which.

DETAILED DESCRIPTION

FIGS. 1-9 show the results of steps of one exemplary process for fabricating a capacitive element, implemented successively in the order in which the figures are numbered. The figures illustrate a section through a semiconductor substrate SUB, from the side of a front face FA of the substrate SUB. The front face FA is the face located at the FEOL (front end of line) of the integrated circuit during fabrication.

Figure 9:
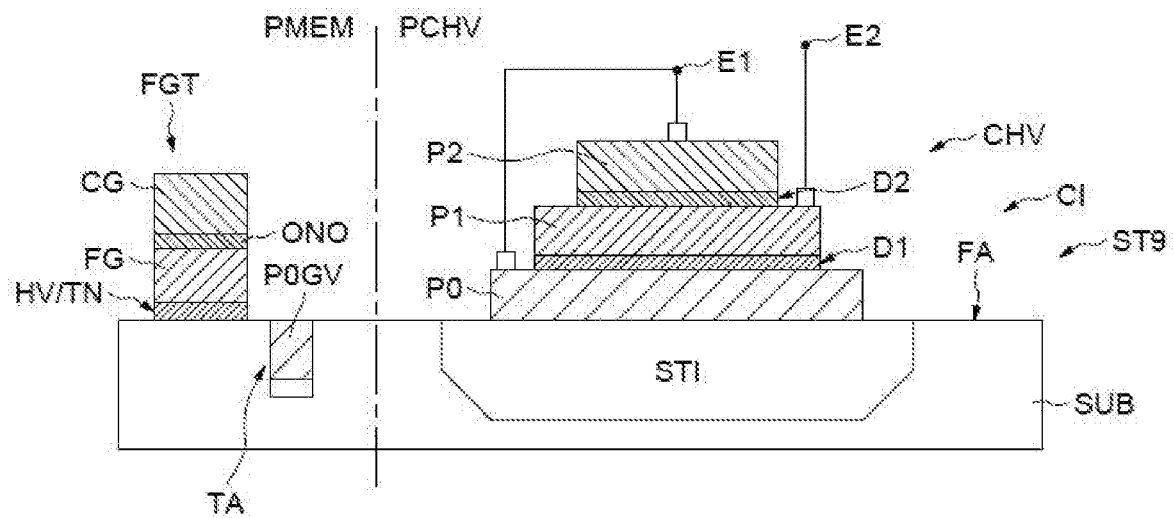

Two parts of the integrated circuit are schematically shown: one part PCHV corresponds to a part in which an advantageous capacitive element CHV is produced (FIG. 9). Another part PMEM corresponds to a part that is ultimately intended to include another device of the integrated circuit.

In the exemplary process described with reference to FIGS. 1 to 9, the fabrication steps that are intended to form the device in the part PMEM are advantageously used in parallel to fabricate the capacitive element CHV. To this end, the device of the integrated circuit in the part PMEM may advantageously include buried vertical-gate transistors TA and floating-gate transistors FGT, as for example in certain known embodiments of memory cells of a nonvolatile memory.

Figure 1:
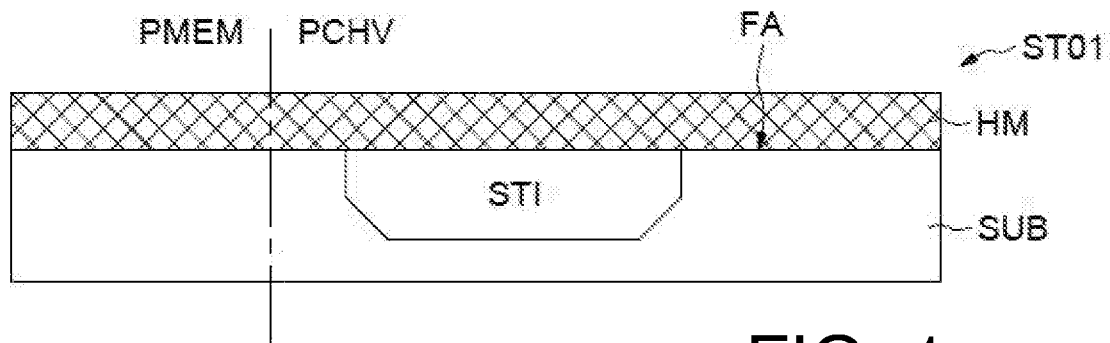
FIGS. 1-9 illustrates steps of a process for one exemplary implementation of producing an integrated circuit capacitive element.

FIG. 1 shows the result of a step ST01 comprising an operation of forming a dielectric region STI.

The dielectric region STI is advantageously a shallow trench isolation, and extends into the substrate SUB from the front face FA. Unlike a dielectric region having a layered structure, the dielectric region STI occupies a volume in the substrate.

The operation of forming the dielectric region STI comprises an operation of etching a trench in the substrate SUB from the front face FA and an operation of filling the trench with a dielectric material.

Other dielectric regions STI (not shown) are formed elsewhere in the integrated circuit, typically for the purpose of lateral electrical insulation between neighboring components.

The step ST01 further comprises an operation of forming a hardmask HM layer, for example of silicon nitride, on the front face FA of the substrate SUB.

Figure 2:
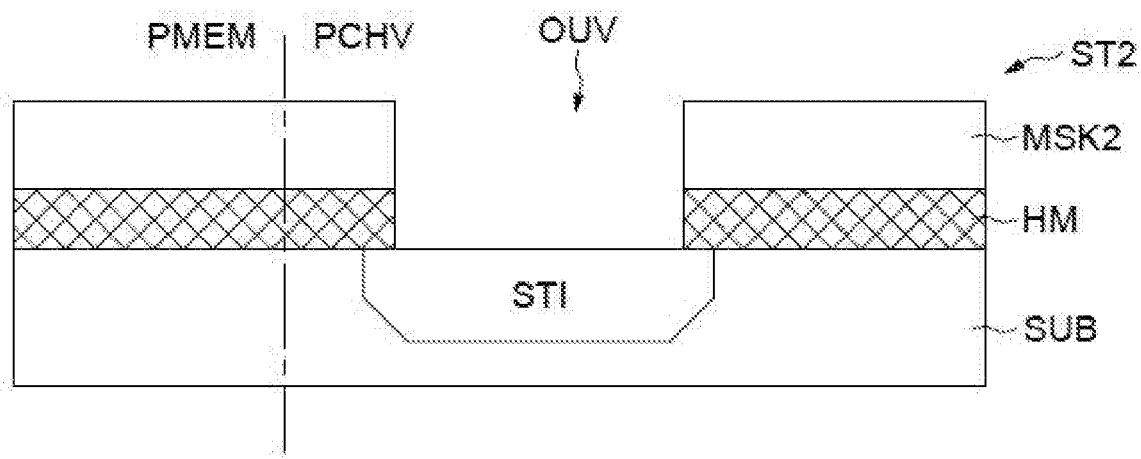

FIG. 2 shows the result of a step ST2 comprising an operation of etching part of the hardmask HM located above the dielectric layer STI, at the site at which the capacitive element CHV will be formed. The etching operation comprises an operation of forming a photolithography mask MSK2 including an aperture OUV defining the zone in which the hardmask HM layer is etched. Once etched, the hardmask HM includes this same aperture OUV thus transferred, which exposes the corresponding part of the dielectric region STI, at the front face FA.

Figure 3:
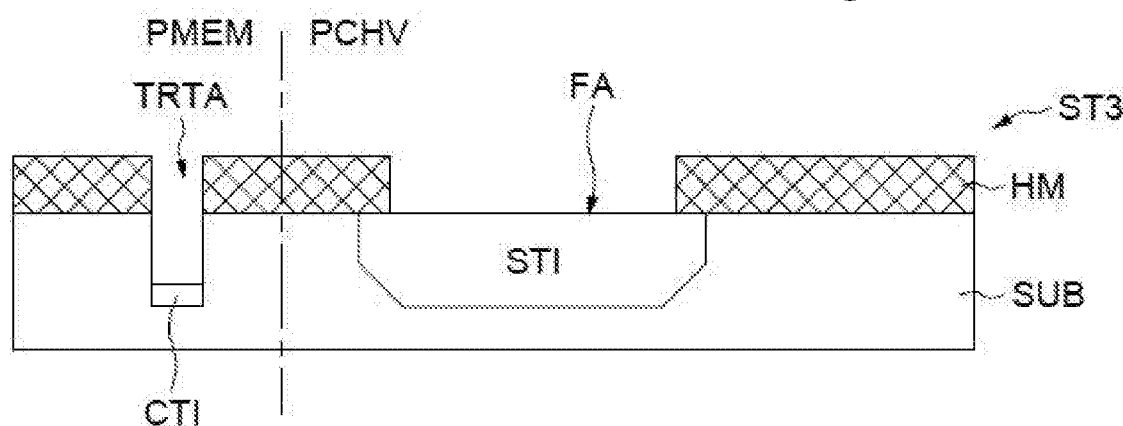

FIG. 3 shows the result of a step ST3 comprising an operation of etching a plurality of, at least one, trench(es) TRTA in the part PMEM of the substrate SUB.

The trenches TRTA extend into the substrate perpendicularly to the front face FA. The position of the trenches TRTA may be defined by a photolithography step including a mask (not shown).

Step ST3 also includes an operation of vertically anisotropically implanting a counter-implant layer CTI, the conductivity type of which (for example, n-type conductivity) is opposite that of the substrate SUB (for example, p-type conductivity) in the semiconductor parts that are not covered by the hardmask HM (such as, in this example, into the bottom of the trenches TRTA).

The trenches TRTA are, for example, intended to accommodate buried vertical-gate transistors, and the implantation of the counter-implant layer CTI is intended to form the source regions of said buried vertical-gate transistors.

Figure 4:
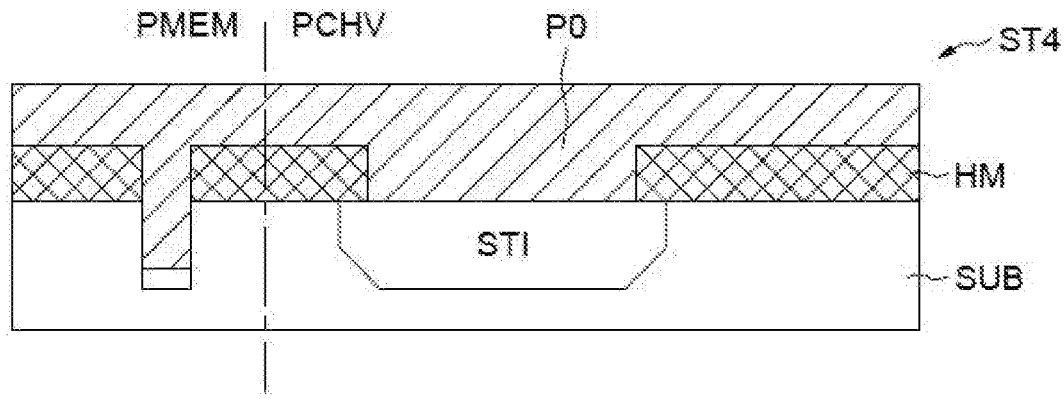

FIG. 4 shows a result of a step ST4 comprising an operation of forming a first conductive region P0 on the dielectric region STI.

The operation of forming the first conductive region P0 on the dielectric region STI comprises an operation of filling the aperture OUV (FIG. 2) with a conductive material P0, which extends out of the aperture over the hardmask HM.

This overrun may be obtained by overfilling with the conductive material P0.

For example, the conductive material P0 may include polycrystalline silicon.

Advantageously, the operation of filling the aperture OUV is carried out together with an operation of filling the trenches TRTA envisaged in a step of forming the vertical gates of the buried transistors in the part PMEM of the integrated circuit. An insulating gate-dielectric envelope, not explicitly illustrated, has been formed beforehand on the flanks and at the bottom of said trenches TRTA.

Figure 5:
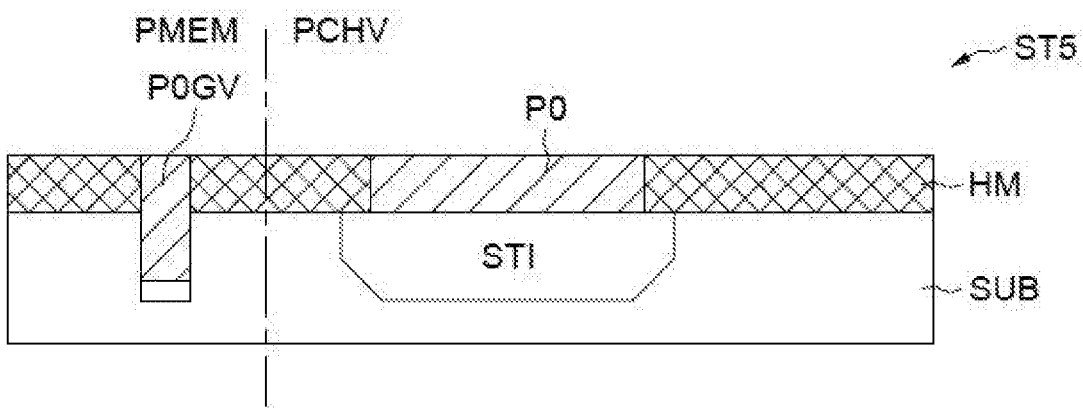

FIG. 5 shows the result of a step ST5 including an operation of levelling the excess conductive layer P0 deposited in step ST4.

The levelling operation comprises an operation of removing the excess deposit of conductive material P0 until the surface of the hardmask HM layer, which may act as a stop layer here, is reached.

The levelling operation may be implemented by means of a chemical-mechanical polishing (CMP) technique, or possibly by means of an etching technique such as a polysilicon-etchback (poly-etchback, PEB) technique parametrized over time according to the thickness of the excess.

Figure 6:
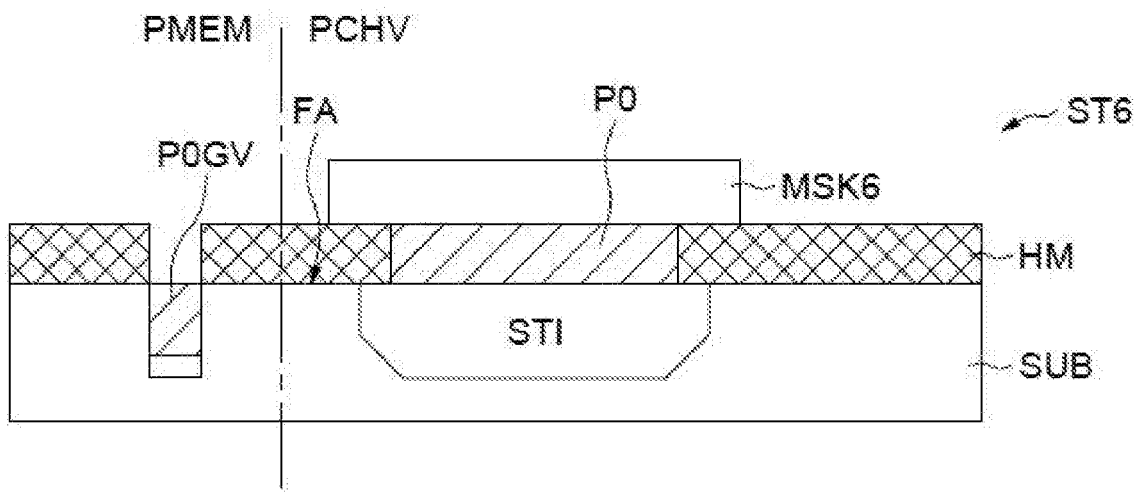

FIG. 6 shows the result of a step ST6 intended to finalize the formation of the vertical gates P0GV of the buried transistors in the part PMEM. Step ST6 comprises an operation of removing, by dry-etching, the part of conductive material P0 remaining at the front face FA, through the thickness of the hardmask HM.

In this step ST6, the first conductive region P0 of the part PCHV is protected by a mask MSK6 which is impermeable to the dry etch.

The dry etch is, for example, typically carried out by means of a controlled-etch process such as a polysilicon-etchback (poly-etchback, PEB) process. The PEB process typically comprises an operation of exposing the integrated circuit, during fabrication, to an ion beam, the energy of which allows a given material (here the conductive material P0) to be removed, for a duration chosen according to the thickness of this material to be etched.

Figure 7:
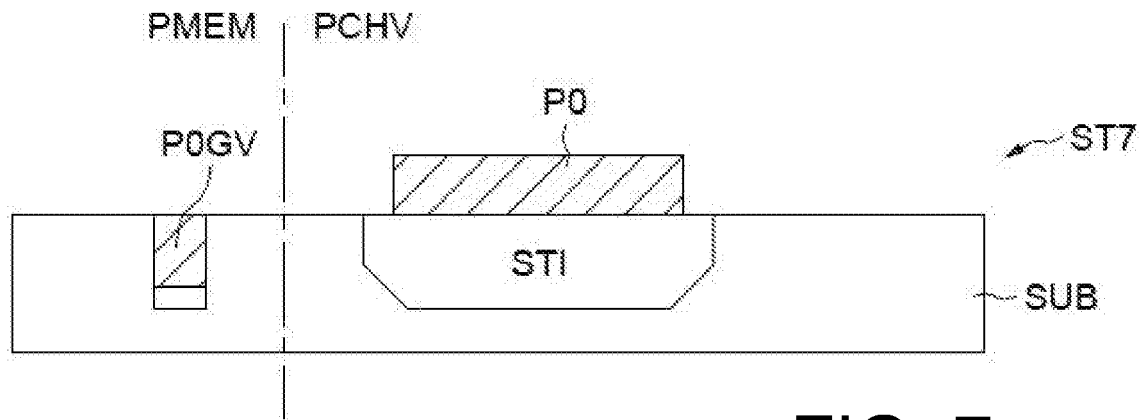

FIG. 7 shows the result of a step ST7 comprising the operation of removing the hardmask HM layer after an operation of removing the mask MSK6 (FIG. 6).

The operation of removing the hardmask HM layer may comprise an operation of selectively wet-etching the material forming the hardmask HM, typically silicon nitride.

Figure 8:
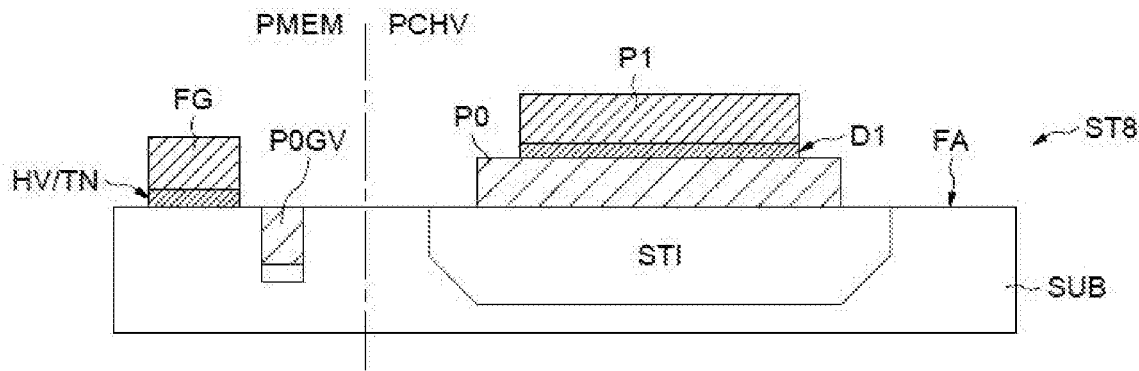

FIG. 8 illustrates a result of a step ST8 comprising an operation of forming a first dielectric layer (a second dielectric region) D1 on the first conductive region P0 followed by an operation of forming a second conductive region P1 on the first dielectric layer D1.

According to one advantageous example, the operation of forming the first dielectric layer D1 is carried out together with an operation of forming a floating-gate or high-voltage-oxide dielectric layer HV/TN of a floating-gate transistor FGT (FIG. 9) or of a high-voltage transistor, respectively, formed in the part PMEM of the substrate SUB.

Thus, according to a first alternative, the first dielectric layer D1 comprises a high-voltage gate oxide HV of the high-voltage transistor.

According to a second alternative, the first dielectric layer D1 comprises a tunnel oxide TN of the floating-gate transistor FGT.

Furthermore, the operation of forming the second conductive region P1 may advantageously be carried out together with an operation of forming a floating-gate conductive region FG of the floating-gate transistor or a gate region of the high-voltage transistor, respectively.

The second conductive region P1 (and the floating-gate conductive region FG) may comprise polycrystalline silicon and, for example, may be formed by uniformly depositing a layer of polycrystalline silicon, typically by epitaxy or chemical vapor deposition, followed by an etch delimited by a photolithography mask. The etch may use the first dielectric layer D1 as a stop layer.

The floating-gate dielectric layer TN comprises, for example, a silicon oxide resting on the front face FA of the semiconductor substrate SUB. The floating-gate conductive region rests on the floating-gate dielectric layer HV/TN. The floating gate FG allows charge to be stored in a nonvolatile manner in order to store binary data.

According to the first alternative mentioned above, the high-voltage oxide HV may be configured to withstand operating voltages of around 11 V so as to be able to route the high voltage to the memory point with a view to injecting positive and negative charges, allowing a binary datum to be written in the floating-gate transistor.

The high-voltage oxide may have a thickness of between 10 nm and 20 nm, for example 15 nm to within 10%.

According to the second alternative mentioned above, the tunnel oxide TN may be configured to withstand injections or extractions of charge into/from the floating gate by Fowler-Nordheim effect, allowing a binary datum to be written in the floating-gate transistor. It may also be configured to withstand injections of hot carriers, positive and negative charges, allowing a binary datum to be written in the floating-gate transistor.

The tunnel oxide may have a thickness of between 5 nm and 15 nm, for example 10 nm to within 10%.

In both cases, the first dielectric layer D1 is configured to withstand voltages of higher than 10 volts, or even 12 volts.

Consequently, the first dielectric layer D1 is capable of withstanding voltages of higher than 3.5 volts, so as to allow the use of the capacitive element CHV (FIG. 9) at high voltages of between 3.5 volts and 10 or even 12 volts.

In these advantageous examples, the first dielectric layer D1 naturally has the same structural characteristics as the high-voltage oxide layer or the floating-gate dielectric layer HV/TN according to the respective chosen alternative.

As such, the first dielectric layer D1 may be produced according to the techniques described above with reference to an operation of fabricating a floating-gate transistor, and have the same structural characteristics, without necessarily being produced together with the floating-gate transistor.

FIG. 9 shows one exemplary embodiment of a capacitive element CHV, resulting from a last step ST9 of the process described above with reference to FIGS. 1 to 8.

Step ST9 comprises an operation of forming a second dielectric layer (a third dielectric region) D2 on the first conductive region P1 and an operation of forming a third conductive region P2 on the second dielectric layer D2.

These formation operations may themselves also be carried out together with operations of forming elements of the floating-gate transistor FGT.

Specifically, according to one advantageous example, the operation of forming the second dielectric layer D2 is carried out together with an operation of forming a control-gate dielectric region ONO of the floating-gate transistor FGT, and the operation of forming the third conductive region P2 is carried out together with an operation of forming a control-gate conductive region CG of the floating-gate transistor FGT.

Thus, the second dielectric layer D2 may include a stack ONO of a silicon oxide layer, of a silicon nitride layer and of a silicon oxide layer.

The stack ONO may have a thickness of between 10 nm and 17 nm, for example 13 nm to within 10% or 15 nm to within 10%.

The second dielectric region D12 is thus configured to withstand voltages of higher than 10 volts, or even 12 volts.

Consequently, the second dielectric layer D2 is capable of withstanding voltages of higher than 3.5 volts, so as to allow the use of the capacitive element at high voltages of between 3.5 volts and 10 or even 12 volts.

The third conductive region P2 may also include polycrystalline silicon.

The third conductive region P2 may also be formed by a uniform deposition technique followed by an etch delimited by a photolithography mask.

Lastly, a first electrode E1 of the capacitive element CHV is formed and comprises the first conductive region P0 and the third conductive region P2.

Meanwhile, the second electrode E2 of the capacitive element comprises the second electrical region P1, which is located between the two conductive regions of the first electrode E1, and is electrically insulated therefrom by the first dielectric layer D1 and by the second dielectric layer D2.

The operation of forming the second electrode E2 may simply comprise an operation of forming a film of metal silicide on a portion of the second conductive region P1, allowing a contact exhibiting little resistance.

The operation of forming the first electrode E1 may simply comprise an operation of forming a film of metal silicide on portions of the first conductive region P0 and of the third conductive region P2, and an operation of electrically coupling these regions via contacts exhibiting little resistance formed from the films of metal silicide.

What has been described is one exemplary fabrication process having the advantage of using fabrication steps that are already envisaged for fabricating a buried vertical-gate transistor TA and a floating-gate transistor FGT for producing a memory cell of a nonvolatile memory PMEM. The costs specific to producing the capacitive element CHV according to this example are minimal.

However, the process is not limited to this example but encompasses all variants thereof, for example it is possible to envisage implementing the process described such that it is dedicated to the production of capacitive element, and other materials and other dimensions may be envisaged within the context of the proposed structure.

Moreover, since the capacitive element is produced on one surface of the volume of a dielectric region, it is isolated from the substrate and does not introduce any parasitic effect transmitted to neighboring components via the substrate and, since it does not include any semiconductor region in its electrodes, the linearity of the capacitive value and the density of the capacitive element are improved.

Consequently, the capacitive element may advantageously incorporate devices in which the capacitive elements perform an essential function and/or are numerous to the point that they have a substantial footprint.

Analog parts of the integrated circuit and radiofrequency receive chains typically require linear capacitive values within a wide range of voltages.

Thus, the integrated circuit CI, for example fabricated according to the examples described above with reference to FIGS. 1 to 9, may advantageously further include an analog or radiofrequency-receiver device in the part PCHV. The analog or radiofrequency-receiver device advantageously incorporates said at least one capacitive element CHV.

Of course, the integrated circuit CI may include a non-volatile memory device PMEM incorporating at least one memory cell comprising a floating-gate transistor FGT and a buried vertical-gate transistor TA.

For example, said analog parts of the integrated circuit and radiofrequency receive chains may incorporate capacitive elements according to the invention in a decoupling capacitor, in compensating circuits or else in radiofrequency filter devices.

The invention claimed is:
1. An integrated circuit, comprising:
   a semiconductor substrate having a front face;
   a shallow trench isolation region in the semiconductor substrate;
   a first transistor supported by said semiconductor substrate;
   a second transistor supported by said semiconductor substrate;
   a capacitive element on top of the shallow trench isolation region;
   wherein the capacitive element includes a first conductive region in contact with an upper surface of the shallow trench isolation region and forming a first electrode of the capacitive element, a second conductive region forming a second electrode of the capacitive element, and a third conductive region forming a third electrode of the capacitive element;
   wherein the first transistor includes a vertical conductive gate extending into the semiconductor substrate;
   wherein the second transistor includes a gate including a floating gate and a control gate extending over the semiconductor substrate;
   a first dielectric layer forming an insulation layer between the first and second conductive regions of the capacitive element and further forming an insulating layer between the floating gate and semiconductor substrate;
   a second dielectric layer forming an insulation layer between the second and third conductive regions of the capacitive element and further forming an insulating layer between the control gate and the floating gate;
wherein the third conductive region and the control gate are formed from a common conductive layer;
wherein the second conductive region and the floating gate are formed from a common conductive layer; and
wherein the first conductive region and the vertical conductive gate are formed from a common conductive layer.

2. The integrated circuit of claim 1, wherein the first and second transistors form a memory element.

3. The integrated circuit of claim 1, wherein the first dielectric layer is a tunnel oxide layer and the wherein the second dielectric layer is an oxide/nitride/oxide stack layer.

4. The integrated circuit of claim 1, wherein the capacitive element comprises a first electrode formed by the first conductive region and the third conductive region which are electrically connected to each other, and a second electrode formed by the second conductive region.

5. The integrated circuit of claim 1, wherein the first conductive region, the second conductive region and the third conductive region are each made of polycrystalline silicon.

6. The integrated circuit of claim 1, wherein the first dielectric layer and the second dielectric layer are configured to withstand voltages of higher than 3.5 volts.

7. The integrated circuit of claim 1, wherein the first dielectric layer and the second dielectric layer are configured to withstand voltages of higher than 10 volts.

8. The integrated circuit of claim 1, wherein the first dielectric layer is a tunnel oxide layer having a thickness of between 5 nm and 15 nm.

9. The integrated circuit of claim 1, wherein the second dielectric layer is an insulating stack of a silicon oxide layer, a silicon nitride layer and a silicon oxide layer, the insulating stack having a thickness of between 10 nm and 17 nm.

* * * * *